United States Patent [19]

Casciotti et al.

[11] Patent Number: 5,061,191
[45] Date of Patent: Oct. 29, 1991

[54] CANTED COIL SPRING INTERPOSING CONNECTOR

[75] Inventors: Albert Casciotti, Hershey, Pa.; Frederick R. Deak, Kernersville, N.C.; Ronald A. Dery, Winston-Salem, N.C.; David B. Wrisley, Jr., Greensboro, N.C.

[73] Assignee: AMP Incorporated, Harrisburg, Pa.

[21] Appl. No.: 631,821

[22] Filed: Dec. 21, 1990

[51] Int. Cl.$^5$ ............................................. H01R 9/09
[52] U.S. Cl. .................................. 439/66; 439/245; 439/840; 29/845
[58] Field of Search ............... 439/66, 74, 245, 247, 439/248, 591, 840; 29/842, 845, 883, 884

[56] References Cited

U.S. PATENT DOCUMENTS

| | | | |
|---|---|---|---|
| 2,153,177 | 4/1939 | Ecker | 439/721 |
| 3,317,885 | 5/1967 | Yost | 339/176 |
| 3,513,434 | 5/1970 | Zielke | 439/840 |
| 3,638,163 | 1/1972 | Loosme | 339/17 M |
| 3,795,884 | 3/1974 | Kotaka | 339/17 LM |
| 4,029,375 | 6/1977 | Gabrielian | 439/66 |
| 4,922,376 | 5/1990 | Pommer et al. | 29/845 |

FOREIGN PATENT DOCUMENTS 1441102  6/1976  United Kingdom ............... 439/840

OTHER PUBLICATIONS

Japanese Utility Model Application 57-109580, with translation.

Primary Examiner—Paula A. Bradley
Attorney, Agent, or Firm—Allan B. Osborne

[57] ABSTRACT

An interposing connector for interconnecting a pattern of conductive areas of opposing spaced apart surfaces. The connector includes a housing having one or more openings therethrough. A plurality of canted coil springs are positioned within the housing so that outer coil portions are exposed to engage the conductive areas of the opposing surfaces to thereby establish the electrical interconnection. The canted coil springs are secured to the housing by retaining means, such as a retainer strip extending through the springs and secured to the housing. The springs may also be secured by heat staking or laser welding a portion thereof to the housing. The canted coil springs have a relatively constant compliance over a range of radial deflection. The springs also produce contact wipe over the conductive areas and establish redundant contact points therewith.

36 Claims, 7 Drawing Sheets

CANTED COIL SPRING INTERPOSING CONNECTOR

The invention relates to the field of electrical connectors and more particularly to an interposing electrical connector for interconnecting conductive areas on two parallel spaced apart surfaces.

BACKGROUND OF THE INVENTION

The trend in the electronics industry is toward smaller devices and packages. The small size of electronic devices requires a high interconnection density. The electronic devices which require a high interconnection density, such as integrated circuits, may typically be mounted on chip carriers which in turn may be mounted to a printed circuit board. The printed circuit board contains other components which must be electrically interconnected to the integrated circuit. The chip carrier and the printed circuit board typically include corresponding patterns of conductive areas that must be electrically interconnected.

The electrical connections between a chip carrier and the printed circuit board may be made by precision soldering of the chip carrier to the printed circuit board. An alternative to soldering, is to position an interposing connector between the two surfaces to be interconnected. The interposing connector must bridge the spacing between the conductive areas to establish the interconnection.

The area used for each conductive area and the spacing between adjacent areas are desirably minimized to achieve a high interconnection density. However, as the area for each connection is reduced, irregularities between the surfaces to be interconnected become more important. For example, any surface imperfections or irregularities may require that some portions of the connector must bridge a larger or smaller spacing than other portions of the connector. A failure of the connector to bridge between all portions of the opposing surfaces results in open circuits. Irregularities may also cause unwanted compression, thereby resulting in permanent deformation and preventing reuse of an interposing connector.

The increasing complexity of modern integrated circuits requires that testing be performed to ensure reliable service. Acceptance testing and burn-in testing are highly desirable to prevent infant failures for integrated circuits. Testing requires that a repeatable and reliable connection be established between each new device under test and the testing apparatus. Since a number of integrated circuits may be mounted on a circuit board, it is also desirable that each integrated circuit be removable for troubleshooting, testing and repair even after its initial testing.

The art has attempted to produce interposing connectors that may be placed between two spaced apart opposing surfaces having a plurality of individual conductive areas. For example, U.S. Pat. No. 3,795,884 to Kotaka discloses an interposing connector block comprising a winding encapsulated in a plastic insulating material revealing exposed portions of the winding and having an axial cut therein. To conform to irregularities in the planar surfaces to be connected, the connector disclosed in Kotaka either has the winding formed of a spring-like material or the plastic housing formed of a resilient material. U.S. Pat. No. 3,638,163 to Loosme discloses a non-conductive resilient tube having a plurality of spaced conductive strips thereon.

SUMMARY OF THE INVENTION

It is therefore an object of the present invention to provide an interposing electrical connector that is suitable for a high interconnection density, such as for interconnecting a chip carrier to a printed circuit board or a test apparatus.

It is another object of the present invention to provide an interposing connector that is readily connected and disconnected.

It is yet another object of the present invention to provide an interposing connector that is reusable.

It is still another object of the present invention to provide an interposing connector that compensates for irregularities in the two surfaces to be interconnected.

It is a further object of the invention to provide an interposing connector that limits maximum deflection to prevent permanent deformation of the connector.

It is yet a further object of the invention to provide an interposing connector that produces contact wipe and establishes redundant contact points to thereby provide a low electrical resistance connection with a reduced normal force.

It is still a further object of the invention to provide a method for manufacturing an interposing connector for interconnecting conductive areas of opposing spaced apart surfaces.

These and other objects according to the present invention are provided by an interposing electrical connector having a housing with one or more openings therethrough. The housing is adapted to be positioned between the opposing surfaces. A plurality of canted coil springs are positioned in the housing arranged in a predetermined pattern corresponding to the pattern of conductive areas. In a preferred embodiment according to the present invention, the housing includes a pattern of conductive areas of the opposing surfaces. In another embodiment, the housing may have a single opening therethrough.

The housing may include means, such as its thickness, for limiting deflection of each of the canted coil springs to a predetermined range of deflection. The limited deflection range may be desirable to prevent permanent deformation of the springs so that the connector is reusable.

The canted coil springs are oriented so that outer coil portions are exposed to electrically interconnect the conductive areas of the opposing surfaces. The canted coil springs preferably have a substantially constant compliance over a predetermined range of deflection. This constant compliance allows the connector to bridge irregularities between the opposing surfaces to be interconnected. The arrangement of the canted coil springs within the housing causes the outer portions of the springs to "wipe" the corresponding conductive areas. In addition, each of the canted coil springs may preferably have at least three coils to establish redundant connection points with the corresponding conductive areas of the opposing surfaces. The canted coil springs, thus, allow for a reduced normal force while still maintaining a low resistance electrical connection. The canted coil springs may be beryllium copper with a gold plating thereon. Retaining means retain the canted coil springs within the housing.

In a preferred embodiment, the housing may be plastic and the means for retaining the canted coil springs within the housing comprises an end portion of each of the springs heat staked to the housing. In another embodiment, the connector has a ceramic housing with a metal layer on predetermined portions thereof. The canted coil springs may then be laser welded to the metal layer to secure the springs within the housing. To fabricate the connector, a spring having alternating coiled and uncoiled portions may be positioned in the housing so that the coiled portions are received in the openings in the housing and the uncoiled portions are received in recesses in the housing. The uncoiled portions of the spring may then be secured to the housing. Preferably, two points of each uncoiled portion are secured to the housing in the recesses, then the uncoiled portion may be severed between the secured points by mechanical or laser cutting. Thus, a plurality of canted coil springs may be formed in the housing.

In another embodiment according to the present invention, one or more retainer strips may be positioned within the canted coil springs to retain the springs within the housing. The strips are preferably sized so as to allow deflection of the canted coil springs within a desired range, such as the range of relatively constant spring compliance or the range of deflection limited by the housing. The retainer strips may be secured to the housing. Alternately, the housing may be formed of two mating halves having a plurality of channels therebetween and the retainer strips may be positioned within the channels. The canted coil springs may also be left "floating" on the retainer strips and then vibrated into the openings of the housing during the fabrication process, or the springs may be secured to the retainer strip. Ends, or uncoiled portions, of the springs may be heat staked to plastic retainer strips or may be laser welded to a metal layer on ceramic strips. As described above, the uncoiled portions of the spring may then be severed to thereby form the individual canted coil springs.

A readily connected and disconnected electrical connection between a pattern of conductive areas of opposing spaced apart surfaces may be made by a method according to the present invention. An interposing connector is positioned between opposing surfaces with each surface having a pattern of conductive areas thereon. The connector includes a plurality of canted coil springs arranged in a pattern corresponding to the pattern of the conductive areas. The canted coil springs are retained in the housing by retaining means, such as one or more elongate strips, positioned within each of the springs and secured to the housing. The connector is then secured between the opposing surfaces so that outer coil portions of the springs engage the conductive areas of the surfaces to thereby establish electrical connection therebetween. The deflection of the connector may be limited by the housing thickness, for example, to prevent permanent deformation of the connector so that the connector may be reused.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein; rather, Applicants provide these embodiments so that this disclosure will be thorough and complete, and will fully convey the scope of the invention to those skilled in the art. Like numbers refer to like elements throughout and prime and double prime notation are used to identify similar elements of alternate embodiments according to the present invention.

Figure 1:
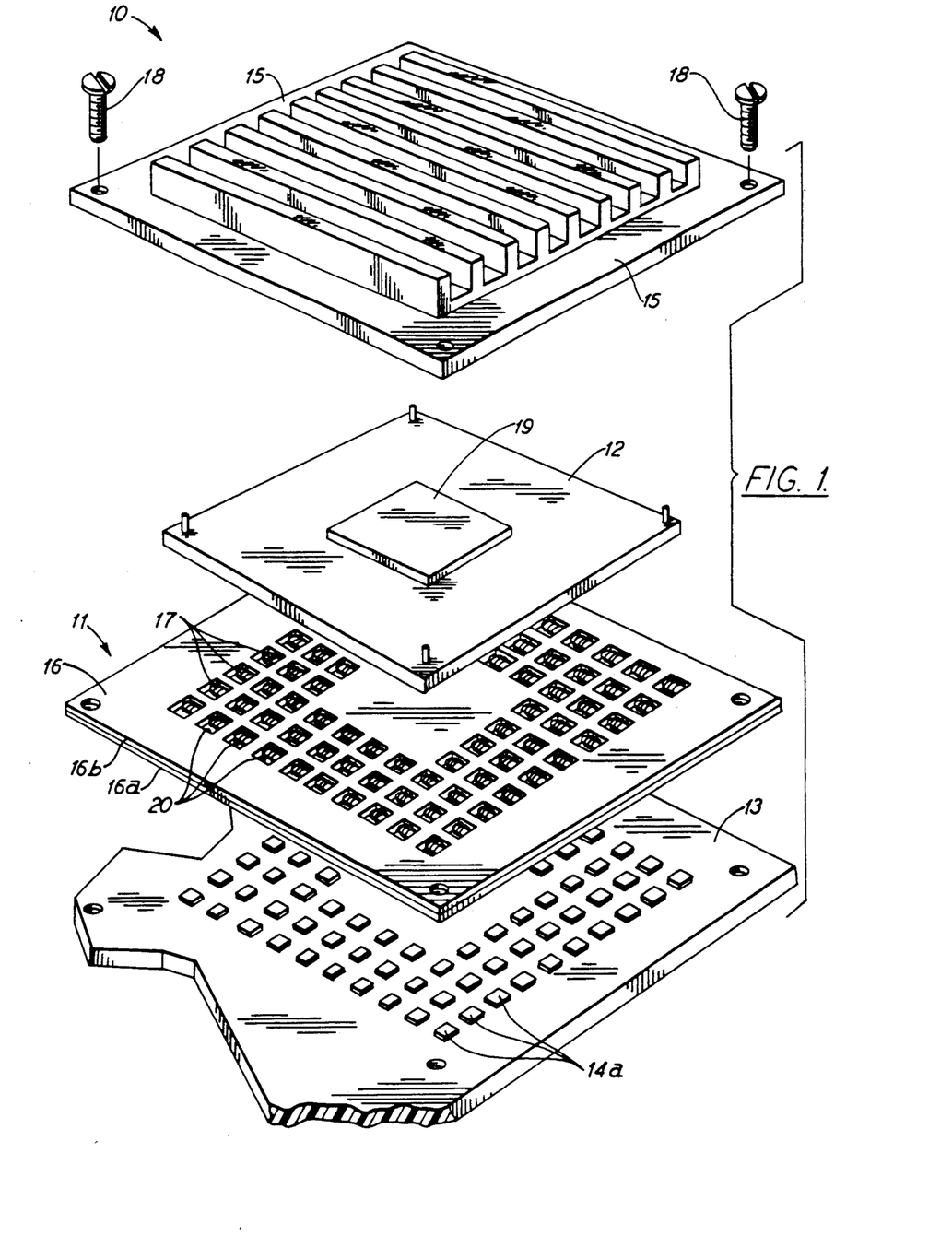
FIG. 1 is an exploded perspective view of an electrical connection using an interposing electrical connector according to the present invention.
Figure 2:
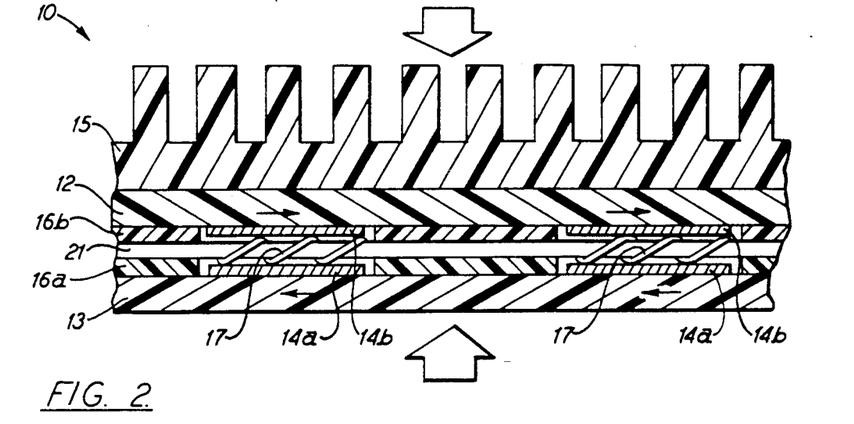
FIG. 2 is a fragmentary cross-sectional side elevation view of the electrical connection as shown in FIG. 1.

FIG. 1 illustrates an exploded view of an electrical connection 10 using the interposing electrical connector 11 according to the present invention. The interposing connector 11 is positioned between a chip carrier 12 and a multilayer printed circuit board 13. The multilayer printed circuit board 13 includes a plurality of conductive areas 14a on its outer surface. The underside of the chip carrier 11 includes a corresponding pattern of conductive areas 14b (FIG. 2). A heat sink 15 may be placed adjacent the chip carrier 11 to remove waste heat from the integrated circuit 19 during its operation.

The interposing connector 11 may be used between any devices employing a pattern of conductive areas thereon and is not limited to the chip carrier 12 and printed circuit board 13 as shown in FIGS. 1 and 2. For example, the interposing connector 11 could also be used between a chip carrier 12 and a test or burn-in socket, not shown.

The interposing connector 11 includes a housing 16 and a plurality of canted coil springs 17 positioned within openings 20 in the housing 16. The canted coil springs 17 are arranged in a predetermined pattern corresponding to the pattern of conductive areas 14a, 14b. The canted coil springs 17 are retained in the housing 16 by retainer means, such as strips 21 extending longitudinally through the springs 17 as shown in FIGS. 1 and 2. The housing 16 may be formed of two mating halves 16a, 16b as shown in FIG. 2. The strips 21 are sized so as not to limit deflection of the canted coil springs 17 as when they are compressed by engagement with the conductive areas 14a, 14b. Other means for retaining the springs 17 within the housing 16 include heat staking, or laser welding a portion of the springs 17 to the housing 16 as further described below.

Outer coil portions of the canted coil springs 17 are exposed on each side of the housing 16 to engage the opposing conductive areas 14a, 14b to thereby establish an electrical connection therebetween. Since the conductive areas 14a, 14b are typically thin metal layers on the chip carrier 12 and the printed circuit board 13, the coil springs 17 and housing 16 are sized so that outer coil portions of the springs 17 may extend outwardly beyond the housing 16 prior to engaging the conductive areas 14a, 14b.

The heat sink 15, chip carrier 12, interposing connector 11, and printed circuit board 13 may be aligned and assembled together using fastening means, such as screws 18, positioned at the corners. The connection 10 using the interposing connector 11 of the present invention, unlike a soldered connection, is readily disconnected and reconnected. The interposing connector 11 may also be reused. The interposing connector 11 is, therefore, advantageous for chip burn-in and testing, and also for permanent mounting to aid in further maintenance and troubleshooting of integrated circuits and other components.

Figure 3:
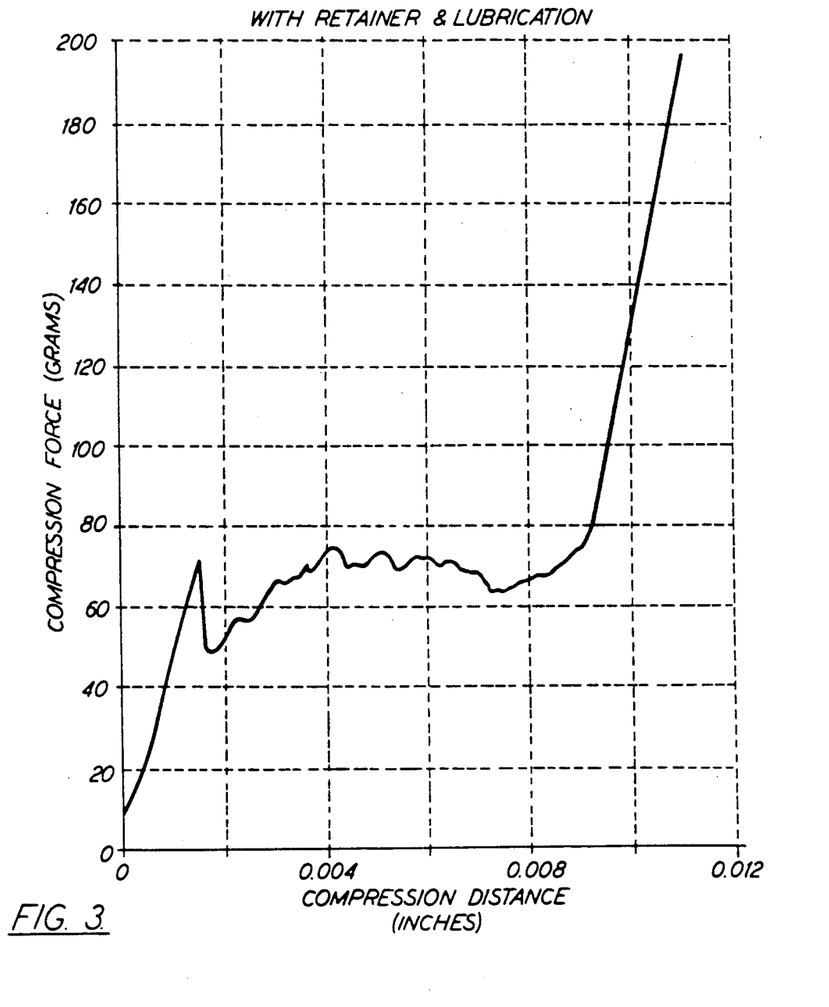
FIG. 3 is a graph of force versus deflection for a canted coil spring used in the interposing electrical connector according to the present invention.

The canted coil springs 17 provide a number of advantages. The first is that the springs 17 have a fairly constant compliance (normal force) over a relatively large range of radial deflection as shown by the graph of FIG. 3. The force generated by a spring is typically given by multiplying the spring constant times the deflection, that is, the greater the deflection the greater the force. However, the canted coil springs 17 exhibit a relatively constant compliance over a range of radial deflection. This constant compliance allows the springs 17 to conform to imperfections and irregularities in the planar surfaces of the chip carrier 12 and the printed circuit board 13.

A preferred number of coils to connect typical conductive areas, as may be used on a chip carrier 12, is from three to six coils for each canted coil spring 17. FIG. 3 shows the force, in grams, generated by a three-coil spring having a height of 0.025", a width of 0.027", and a wire diameter of 0.0045". The plot shows the force required to radially compress the spring. As clearly shown, the three-coil canted coil spring shows a fairly constant compliance over the range of compression from about 0.0015" to about 0.009" corresponding to a percent deflection of about 5% to about 30%. The canted coil spring is available from Bal Seal Engineering Company, Inc. of Santa Ana, California under the designation X33965. The spring material may be beryllium copper having a gold plating over a nickel plating. Other suitable materials include phosphor bronze, Elgiloy, or plated stainless steel.

The housing 16 may have a predetermined thickness to ensure that each of the canted coil springs 17 remains in the desired deflection range when the connection 10 is assembled. The housing 16 and the canted coil springs 17 may be sized to account for manufacturing tolerances for the chip carrier 12 and the printed circuit board 13. The interposing connector 11 may also compensate for wear or thermally induced irregularities in the two surfaces to be interconnected.

The housing 16 may be formed of a rigid plastic or ceramic material, or may be formed of a compressible, or flexible material to provide environmental sealing, for example, for the completed connection 10. The housing 16 may also include only a single central opening therein rather than the plurality of openings 20 as shown, as long as the canted coil springs 17 are positioned in a predetermined pattern corresponding to the conductive areas 14a, 14b by the retaining means.

A second advantage of the canted coil springs 17 is that they provide a contact wiping action between the conductive areas 14a, 14b. As shown in FIG. 2, assembling the connection 10 requires a normal force illustrated by the large vertical arrows. The normal force causes the outer coil portions of the canted coil springs 17 to move laterally across the corresponding conductive areas 14a, 14b, as shown by the small horizontal arrows, thereby providing contact wipe. Minor surface contaminants may be removed by the wiping action. As would be readily understood by those having skill in the art, contact wipe also allows a lower normal force to be used for the connection 10 while still providing a low electrical resistance connection.

A third advantage of the canted coil springs 17 is that the plurality of coils provide redundant contact points with the conductive areas 14a, 14b. The redundant contact points further ensure a low resistance electrical connection even when the connector 11 is reused a number of times. The redundant contact points also allow a lower normal force to be used for the connection 10 as would be readily understood by those having skill in the art.

Figure 4A:
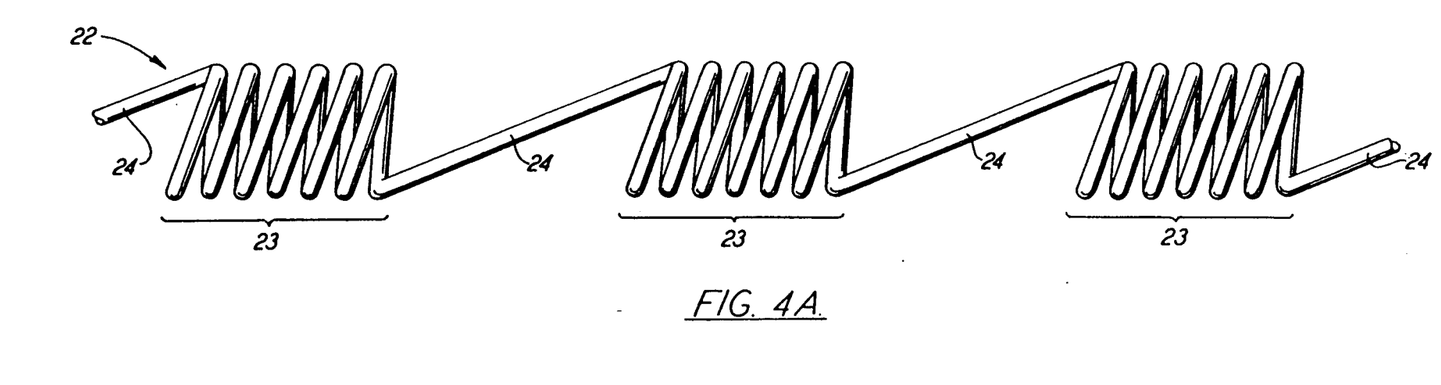
FIG. 4A is a side elevation view of a canted coil spring used in an interposing connector according to an alternative embodiment of the present invention.
Figure 4B:
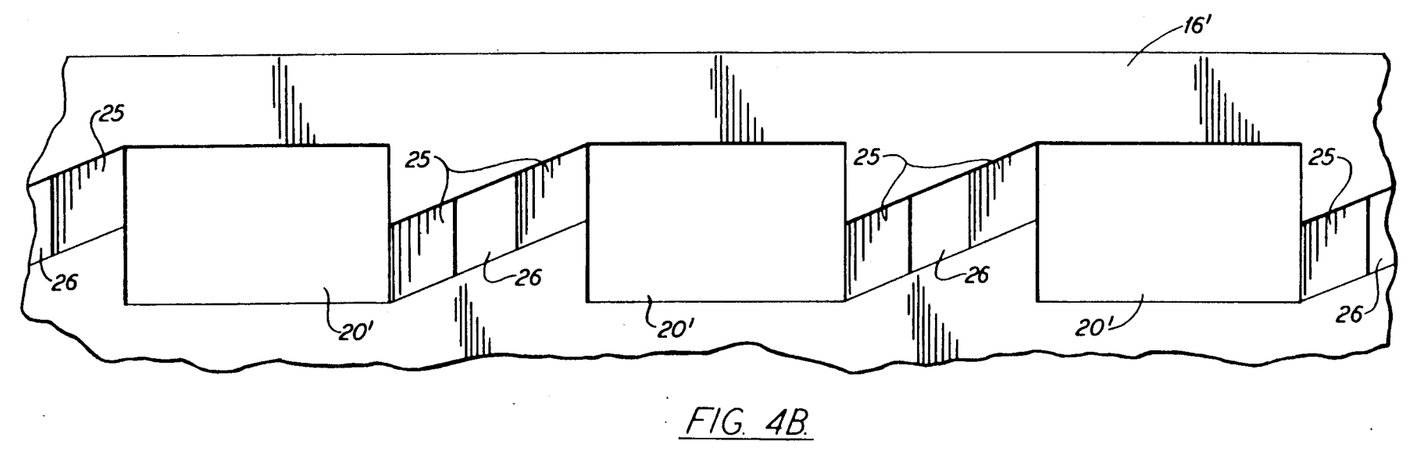
FIG. 4B is a plan view of a portion of a housing with the canted coil spring of FIG. 4A.
Figure 4C:
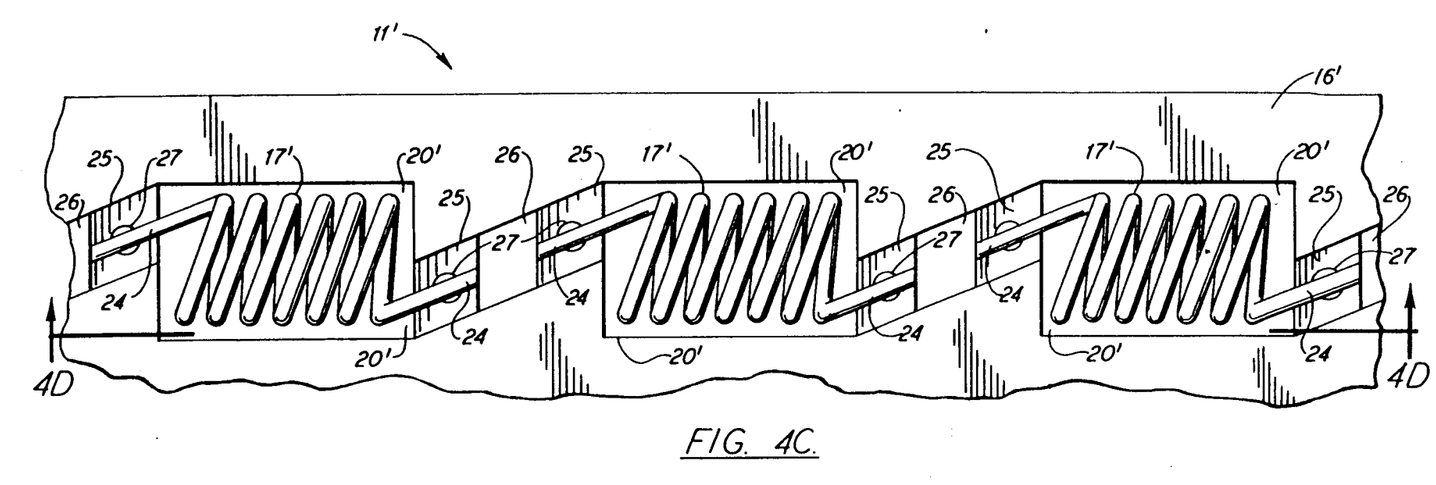
FIG. 4C is a plan view of a portion of the housing shown in FIG. 4B with the canted coil spring as shown in FIG. 4A installed therein.
Figure 4D:
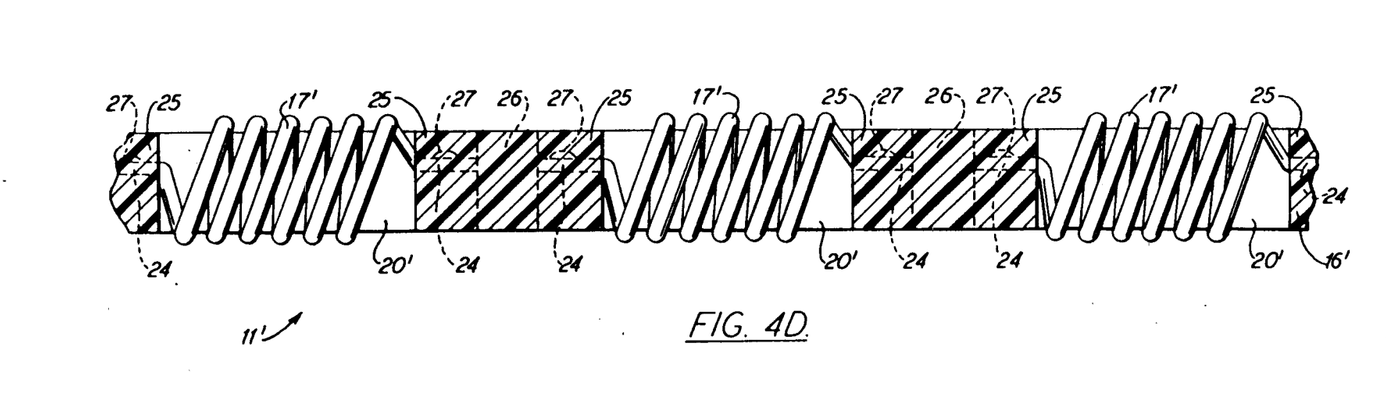
FIG. 4D is a cross-sectional side elevation view along the lines 4D—4D as shown in FIG. 4C.

The interposing connector 11 may be produced by several methods. FIG. 4A illustrates a spring 22 formed with a plurality of canted coil portions 23 connected by uncoiled portions 24. The spring 22 is positioned within a housing 16' (FIG. 4B) having a plurality of openings 20' therethrough corresponding to the desired location of the coil portions 23 of the spring 22. The housing 16' further includes recesses 25 formed therein to receive the uncoiled portions 24 of the spring 22. Between adjacent recesses 25, openings 26 are formed through the housing 16'. The uncoiled portions 24 may then be heat staked to the housing 16' in the recesses 25 if the housing is a plastic material. For a ceramic housing 16', a metallization layer, not shown, is first formed in the housing, then the uncoiled portions 24 are laser welded to the metal layer. The heat staked or laser welded spring portions 27 provide the means for retaining the canted coil spring 22 in the housing 16'. A laser, or other severing means, may then be used to sever the uncoiled portions 24 through the openings 26 between the recesses 25, leaving a series of individual canted coil springs 17' as shown in FIGS. 4C and 4D.

An alternate method of making the interposing connector 11 according to the present invention, is shown in FIGS. 5A through 5E. The canted coil spring 22' includes coiled 23' and uncoiled portions 24'. The spring 22' is positioned on an elongate rectangular strip 21'. Uncoiled portions 24' of the spring 22' are heat staked or laser welded to the strip 21' as described above. The uncoiled portions 24' between adjacent coiled portions 23' are then severed through openings 28 in the strip 21' as also described above. The heat staked or laser welded spring portions 27' provide the means for retaining the canted coil spring 22' on the strip 21'. One or more strips 21' may then be positioned in a two-piece housing having two mating halves 16a'', 16b'' (FIG. 5E) having one or more channels 32 formed therein, to thereby secure the strips 21' and individual canted coil springs 17'' therein.

Figure 5A:
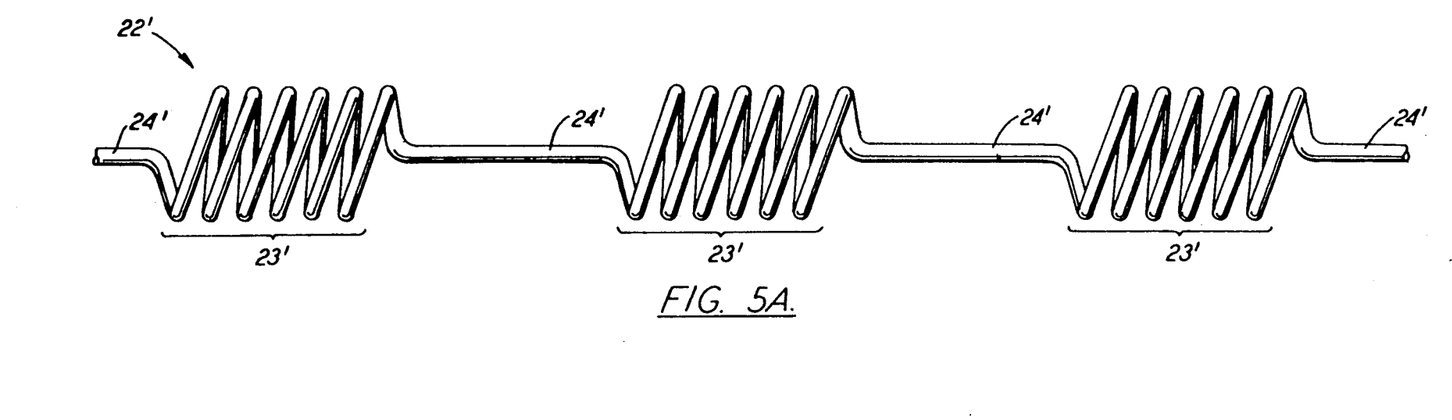
FIG. 5A is a side elevation view of a canted coil spring used in a further embodiment of an interposing connector according to the present invention.
Figure 5B:
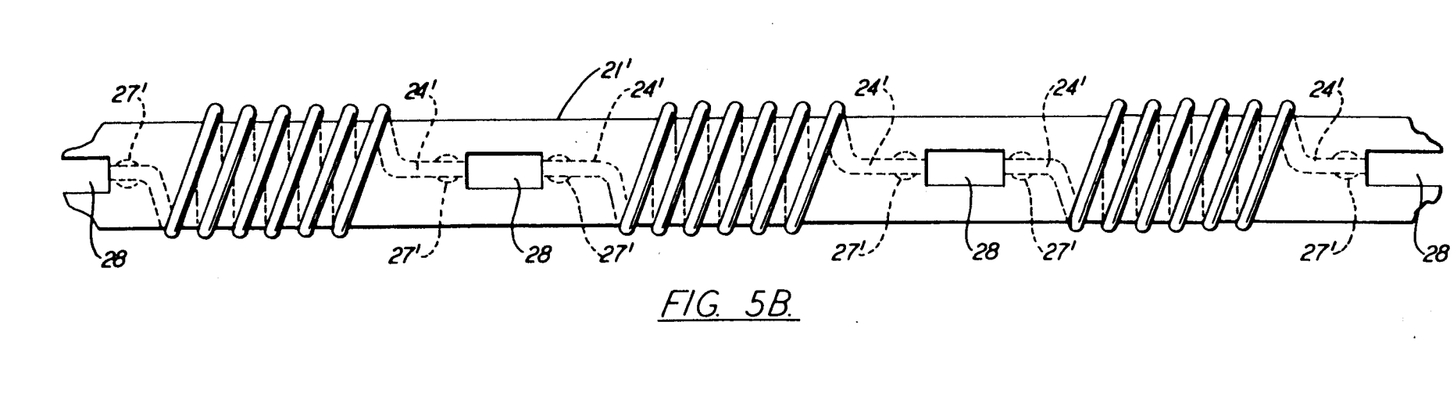
FIG. 5B is a plan view of a portion of a retainer strip with the canted coil spring as shown in FIG. 5A installed thereon.
Figure 5C:
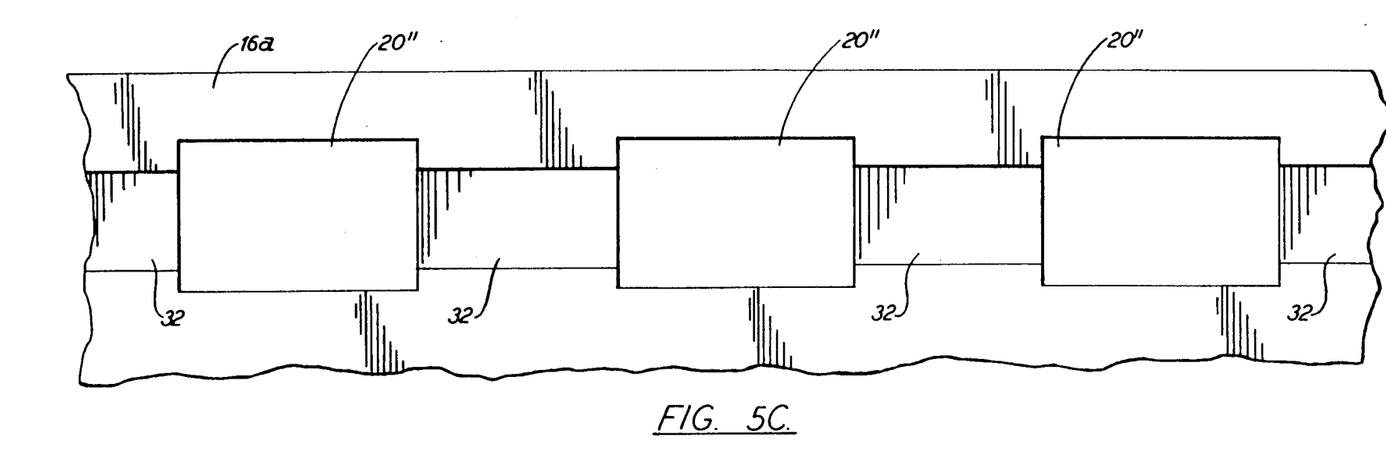
FIG. 5C is a plan view of a portion of a housing used in the further embodiment of an interposing connector according to the present invention.
Figure 5D:
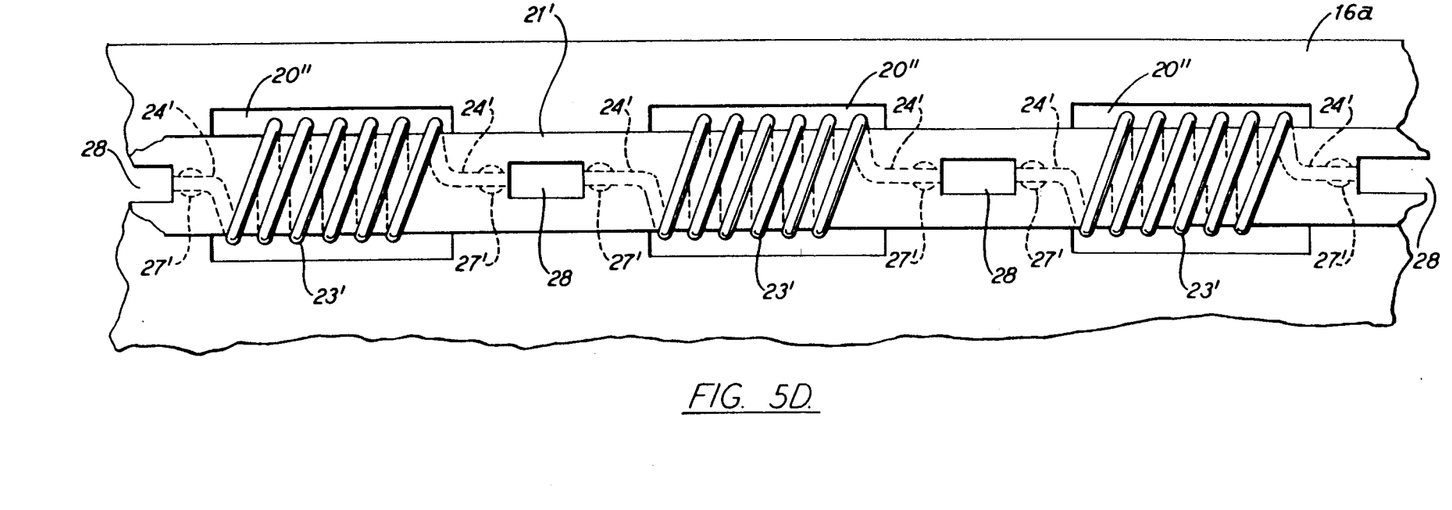
FIG. 5D is a plan view of a portion of the housing shown in FIG. 5C with the retainer strip as shown in FIG. 5B installed therein.
Figures 5E, 6A:
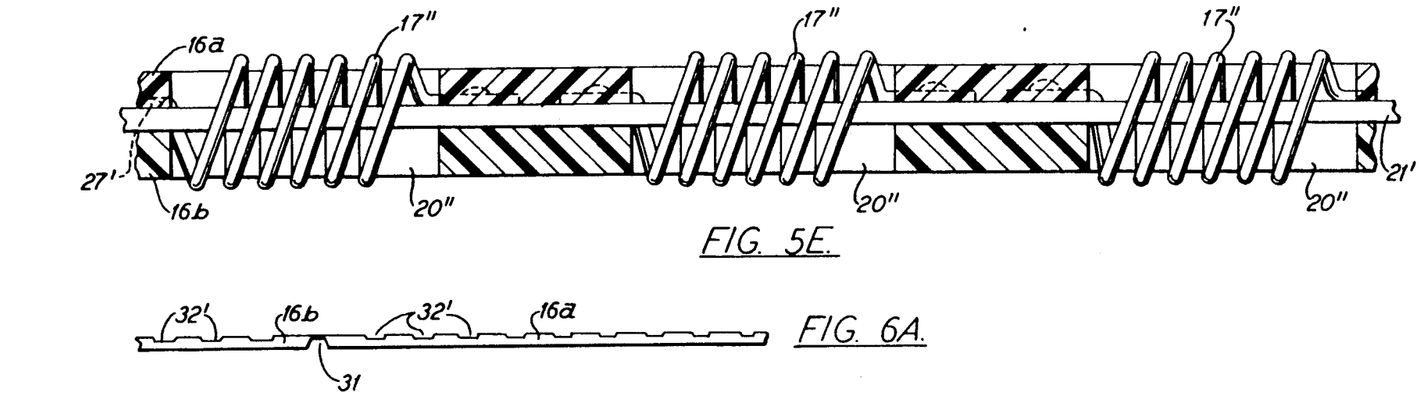
FIG. 5E is a cross-sectional side elevation view of the further embodiment of the interposing connector according to the present invention.
FIG. 6A is a side elevation view of a portion of the housing as shown in FIGS. 1 and 2 according to the present invention.
Figure 6B:
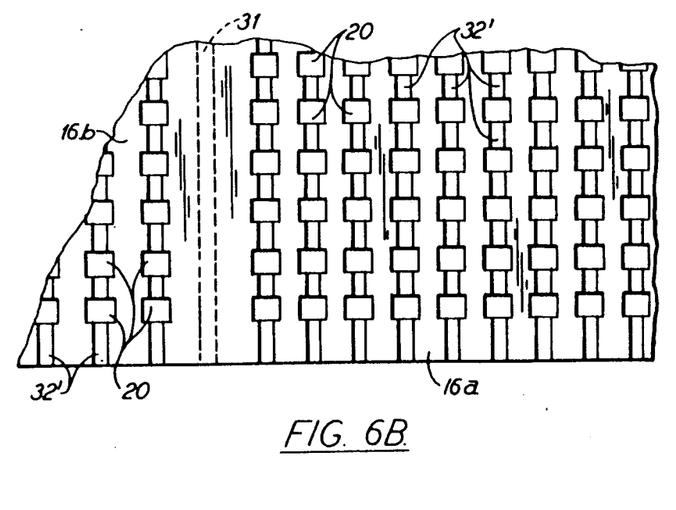
FIG. 6B is a plan view of a portion of the housing in FIG. 6A according to the present invention.
Figure 6C:
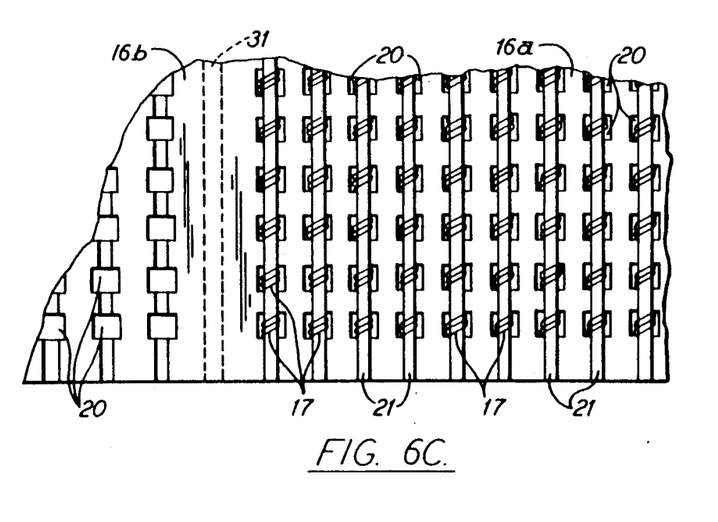
FIG. 6C is a plan view of a portion of the housing in FIG. 6A with retainer strips and springs positioned therein.

Referring to FIGS. 6A through 6C, there is shown another method of making the interposing connector 11 according to the present invention. A housing 16 having two mating halves 16a, 16b, with a hinged portion 31 along a length thereof, is formed with a plurality of channels 32' therein and a plurality of rectangular openings 20 for receipt therein of the canted coil springs 17. Elongate retainer strips 21 are positioned through the plurality of canted coil springs 17. The strips 21 and springs 17 may then be positioned into the channels 32' so that each spring 17 "floats" within one opening 20. The springs 17 may be positioned within the openings 20 by means such as vibration during placement of the strips 21 in the housing half 16a, as would be readily understood by those having skill in the art. The mating housing halves 16a, 16b may then be joined together to complete the fabrication of the interposing connector 11.

Many modifications and other embodiments of the invention will come to one skilled in the art having the benefit of the teachings presented in the foregoing descriptions and the associated drawings. Therefore, it is to be understood that the invention is not to be limited to the specific embodiment disclosed, and that modifications and embodiments are intended to be included within the scope of the appended claims.

That which is claimed is:

1. An interposing connector adapted for electrically interconnecting a pattern of conductive areas of opposing spaced apart surfaces, said connector comprising:
   a housing having one or more openings therethrough and adapted to be positioned between the opposing surfaces;
   a plurality of canted coil springs arranged in a predetermined pattern in said one or more openings, each of said springs being oriented so that at least three coils thereof establish electrically redundant connection points with the corresponding conductive areas of the opposing surfaces; and
   means for retaining said canted coil springs in said one or more openings of said housing.

2. The interposing connector of claim 1 wherein said housing has a plurality of said openings therethrough arranged in said predetermined pattern, and wherein one of said springs is positioned in each of said openings.

3. The interposing connector of claim 1 wherein each of said canted coil springs has a substantially constant compliance over a predetermined range of deflection.

4. The interposing connector of claim 1 wherein each of said canted coil springs comprises beryllium copper having a gold plating thereon.

5. The interposing connector of claim 1 wherein said housing is plastic, and wherein said retainer means comprises an end portion of each of said springs being heat staked to a portion of said housing.

6. The interposing connector of claim 1 wherein said housing is ceramic with a metal layer on predetermined portions thereof, and wherein said retainer means comprises an end portion of each of said springs being welded to a portion of said metal layer.

7. The interposing connector of claim 1 wherein said housing has a predetermined thickness for limiting deflection of each of said canted coil springs to a predetermined range of deflection.

8. The interposing connector of claim 7 wherein said outer coil portions are exposed on each side of said housing.

9. An interposing connector adapted for electrically interconnecting a pattern of conductive areas of opposing spaced apart surfaces, the connector comprising:
   a housing having one or more openings therethrough and adapted to be positioned between the opposing surfaces;
   a plurality of canted coil springs arranged in a predetermined pattern, each of said springs being oriented so that at least three coils establish electrically redundant connection points with the corresponding conductive areas of the opposing surfaces; and
   means for retaining said canted coil springs in said one or more openings of said housing, said retaining means being positioned within each of said canted coil springs and secured to said housing.

10. The interposing connector of claim 9 wherein said housing has a plurality of said openings therethrough arranged in said predetermined pattern, and wherein one of said springs is positioned in each of said openings.

11. The interposing connector of claim 9 wherein said housing has a predetermined thickness for limiting deflection of each of said canted coil springs to a predetermined range of deflection.

12. The interposing connector of claim 9 wherein each of said canted coil springs has a substantially constant compliance over a predetermined range of deflection.

13. The interposing connector of claim 9 wherein each of said canted coil springs comprises beryllium copper having a gold plating thereon.

14. The interposing connector of claim 9 wherein said retainer means comprises one or more elongate strips.

15. The interposing connector of claim 14 wherein each of said strips is sized to permit a predetermined range of deflection of each of said canted coil springs.

16. The interposing connector of claim 14 wherein said housing includes one or more channels therein for receipt therein of each of said strips.

17. The interposing connector of claim 14 wherein said housing comprises two mating portions with one or more channels formed therebetween for receipt therein of each said strips.

18. The interposing connector of claim 14 wherein each of said strips are plastic, and wherein an end portion of each of said canted coil springs is heat staked to a portion of said plastic strips.

19. The interposing connector of claim 14 wherein each of said strips are ceramic with a metal layer on predetermined portions thereof, and wherein an end portion of each of said canted coil springs is laser welded to a portion of said metal layer.

20. A method of making an interposing connector adapted for electrically interconnecting a pattern of conductive areas of opposing spaced apart surfaces, said method comprising the steps of:

providing a housing having one or more openings therethrough and adapted to be positioned between the opposing surfaces;

positioning a plurality of canted coil springs in the one or more openings of the housing in a predetermined pattern corresponding to the pattern of conductive areas, with each of the springs oriented so that; at least three coils establish electrically redundant connection points with the corresponding conductive areas of the opposing surfaces; and securing the plurality of canted coil springs in the one or more openings of the housing.

21. The method of claim 20 wherein said step of positioning the plurality of canted coil springs comprises the steps of:

providing a canted coil spring having an alternating series of coiled and uncoiled portions; and positioning the canted coil spring in the housing, the housing having a pattern of openings therein to receive the coiled portions of the spring and having a pattern of recesses therein to receive the uncoiled portions of the spring.

22. The method of claim 21 wherein said step of securing the canted coil spring to the housing comprises the step of heat staking the uncoiled portions of the spring to the housing.

23. The method of claim 22 further comprising the step of severing the canted coil spring through the uncoiled portions thereof to thereby form the plurality of canted coil springs.

24. The method of claim 21 wherein said step of securing the canted coil spring to the housing comprises the step of welding the uncoiled portions of the spring to a metal layer of the housing.

25. The method of claim 24 further comprising the step of severing the canted coil spring through the uncoiled portions thereof to thereby form the plurality of canted coil springs.

26. A method of making an interposing connector adapted for electrically interconnecting a pattern of conductive areas of opposing spaced apart surfaces, said method comprising the steps of:

positioning a plurality of canted coil springs on a retainer strip; and securing the retainer strip to a housing having a plurality of openings therethrough arranged in a predetermined pattern so that outer coil portions of the springs are exposed on each side of the housing so as to be adapted to electrically interconnect corresponding conductive areas of the opposing surfaces.

27. The method of claim 26 wherein said step of securing the retainer strip to the housing comprises the steps of positioning the strip in a channel between two mating halves of the housing, and securing the mating halves together to thereby secure the retainer strip therebetween.

28. The method of claim 27 wherein said step of positioning the canted coil springs on the strip comprises the step of vibrating the plurality of springs on the strip to position each of the springs in the openings of the housing.

29. The method of claim 26 wherein said step of positioning the canted coil springs on the retainer strip comprises positioning a canted coil spring having alternating coiled and uncoiled portions on the retainer strip.

30. The method of claim 29 further comprising the step of heat staking the uncoiled portions of the canted coil spring to the retainer strip.

31. The method of claim 30 further comprising the step of severing the uncoiled portions of the canted coil spring to thereby form the plurality of canted coil springs.

32. The method of claim 29 further comprising the step of welding uncoiled portions of the canted coil spring to a metal layer of the retainer strip.

33. The method of claim 32 further comprising severing the uncoiled portions of the canted coil spring to thereby form the plurality of canted coil springs.

34. A method of making an electrical connection between a pattern of conductive areas of opposing spaced apart surfaces, said method comprising the steps of:

positioning an interposing connector between the opposing surfaces, the connector comprising a plurality of canted coil springs arranged in a housing in a pattern corresponding to the pattern of the conductive areas, with the coils secured to the housig by retainer means positioned therethrough; and securing the connector between the opposing surfaces so that outer coil portions of the springs engage the conductive areas on the surfaces to thereby establish electrical connection therebetween.

35. The method of claim 34 further comprising the step of limiting the deflection of the canted coil springs to a predetermined range of deflection.

36. The method of claim 35 wherein the step of limiting deflection of the canted coil springs comprises the step of providing a housing having a predetermined thickness corresponding to the predetermined deflection range of the canted coil springs.

* * * * *

UNITED STATES PATENT AND TRADEMARK OFFICE
CERTIFICATE OF CORRECTION

PATENT NO. : 5,061,191

DATED : October 29, 1991

INVENTOR(S) : Albert Casciotti, Frederick R. Deak, Ronald A. Dery, et al

It is certified that error appears in the above-identified patent and that said Letters Patent is hereby corrected as shown below:

Column 8, line 55, after "each" insert --of--.

Column 10, line 38, delete "housig" and insert --housing--.

Signed and Sealed this

Ninth Day of March, 1993

Attest:

STEPHEN G. KUNIN

Attesting Officer

Acting Commissioner of Patents and Trademarks